(12) United States Patent
Lin et al.

(10) Patent No.: US 10,198,539 B1
(45) Date of Patent: Feb. 5, 2019

(54) SYSTEMS AND METHODS FOR DYNAMIC RTL MONITORS IN EMULATION SYSTEMS

(71) Applicant: CADENCE DESIGN SYSTEMS, INC., San Jose, CA (US)

(72) Inventors: Tsair-Chin Lin, San Jose, CA (US); Jingbo Gao, San Jose, CA (US); Alon Kfir, San Jose, CA (US); Long Wang, San Jose, CA (US); Wei Zeng, San Jose, CA (US); Zhao Li, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/448,436

(22) Filed: Mar. 2, 2017

(51) Int. Cl.
*G06F 17/50* (2006.01)

(52) U.S. Cl.
CPC ...... *G06F 17/5027* (2013.01); *G06F 17/5009* (2013.01)

(58) Field of Classification Search
CPC .................................................. G06F 17/5027
USPC ....................................................... 716/106
See application file for complete search history.

(56) References Cited

U.S. PATENT DOCUMENTS

| | | | |
|---|---|---|---|
| 5,960,191 A | 9/1999 | Sample et al. | |
| 6,051,030 A | 4/2000 | Beausoleil et al. | |
| 6,484,135 B1 * | 11/2002 | Chin | G06F 17/5022 703/13 |
| 8,108,729 B2 * | 1/2012 | Brunot | G06F 17/5022 714/29 |
| 2004/0111252 A1 * | 6/2004 | Burgun | G01R 31/3183 703/28 |
| 2005/0267730 A1 | 12/2005 | Kfir et al. | |
| 2006/0075367 A1 * | 4/2006 | Chan | G01R 31/318314 716/108 |
| 2008/0082946 A1 * | 4/2008 | Zilic | G06F 17/504 716/103 |
| 2017/0083655 A1 * | 3/2017 | Larzul | G06F 17/5054 |

* cited by examiner

*Primary Examiner* — Suresh Memula
(74) *Attorney, Agent, or Firm* — Eric L. Sophir; Dentons US LLP

(57) ABSTRACT

Systems, methods, and products implementing a dynamic register transfer level (DRTL) monitor are disclosed. The DRTL monitor may be rapidly constructed and implemented in one or more emulator devices during the runtime of the emulation of a device under test (DUT). The systems may receive monitor modules and corresponding monitor instances in high level hardware description language and compile the monitor modules and instances to generate a monitor within the one or more emulator devices. The systems may then connect one or more input ports of the monitor to one or more signal sources in the DUT. The systems may further allow removal of the monitor, addition or more monitors, and/or modification of the monitor during the run time of the emulation of the DUT.

20 Claims, 3 Drawing Sheets

SYSTEMS AND METHODS FOR DYNAMIC RTL MONITORS IN EMULATION SYSTEMS

TECHNICAL FIELD

This application relates generally to integrated circuit (IC) testing and verification systems, methods, and products; and more specifically to systems, methods, and products for dynamically constructing and implementing a monitor during the runtime of an emulator.

BACKGROUND

Emulation systems may comprise hardware components, such as emulation chips and processors, capable of processor-based (e.g., hardware-based) emulation of logic systems, such as integrated circuits (ICs), application specific integrated circuits (ASICs), central processing units (CPUs), graphics processing units (GPU), field-programmable gate arrays (FPGAs), and the like. By executing various forms of programmable logic, the emulation chips may be programmed to mimic the functionality of nearly any logic system design that is undergoing testing and verification. In other words, emulation systems may be used for a functional verification of the logic system design. Processor-based emulation allows logic designers to prototype a logic system design, before a manufacturer expends resources manufacturing a logic system product based on the logic system design. An emulation system may receive a logic system design in a hardware description language (HDL), such as Verilog or VHDL. In the alternative or in addition, the emulation system may receive the logic system design in a proprietary language. The emulation system may also receive a pre-compiled logic system design in a suitable form based on the specification of the emulation system.

In order to debug a logic system design, a user may have to check various design content and design activity during the runtime of emulating the logic system design. For example, a user may have to track the value of a signal in the logic system design, retrieve contents of a memory, and/or check the inputs to and outputs from various portions of the logic system design. Based on these tracked values, the user (or another program) may identify one or more error conditions. In a conventional approach, a logic system designer includes a debugging logic in the logic system design itself. The debugging logic is compiled with the logic system design and loaded in the emulator. This conventional approach of including the debugging logic within the logic system design is time-consuming and highly inefficient. For example, if the debugging logic has to be changed based upon the behavior of the logic system design during the emulation, the user has to go back to the original logic system design, modify the debugging logic, and synthesize, partition, and compile the entire design. Such compilation may take hours, and even days for more complex designs.

SUMMARY

What is therefore needed is a system and method that allows for dynamic construction, implementation, and modification of a debugging logic during the emulation runtime of the associated logic system design or the device under test (DUT). What is further needed is a system and method that allows for modifying the debugging logic without recompiling the DUT each time the debugging logic is modified and therefore saving a user a significant amount of time.

Systems and methods described herein attempt to solve the aforementioned and other problems by allowing a dynamic construction, implementation, and modification of a monitor to debug a DUT being emulated by an emulation system. In particular, the systems and method may receive monitor modules and/or monitor instances constructed using industry standard languages such as VHDL, Verilog, and System Verilog during the runtime of emulating the DUT. The systems and method may compile the monitor modules and/or monitor instances to generate a monitor in one or more emulator devices emulating the DUT and connect the ports of the monitor to one or more signal sources in the DUT.

In one embodiment, a method of emulating hardware logic comprises: receiving, by an emulation system, a first set of one or more hardware specification files forming a hardware logic design to be emulated; generating, by the emulation system, a device under test (DUT) within one or more emulator devices based upon the first set of hardware specification files; receiving, by the emulation system, a second set of one or more hardware specification files during the runtime of the DUT; generating, by the emulation system, a monitor within the one or more emulator devices based upon the second set of hardware specification files; and connecting, by the emulation system, one or more input ports of the monitor to one or more signal sources in the DUT such that the monitor receives one or more signals from the DUT.

In another embodiment, a system for emulating hardware logic comprises: a computer configured to: receiving a first set of one or more hardware specification files forming a hardware logic design to be emulated; generate a device under test (DUT) within one or more emulator devices based upon the first set of hardware specification files; receive a second set of one or more hardware specification files during the runtime of the DUT; generate a monitor within the one or more emulator devices based upon the second set of hardware specification files; and connect one or more input ports of the monitor to one or more signal sources in the DUT such that the monitor receives one or more signals from the DUT.

BRIEF DESCRIPTION OF THE DRAWINGS

The accompanying drawings constitute a part of this specification and illustrate embodiments of the subject matter disclosed herein.

DETAILED DESCRIPTION

Figure 1:
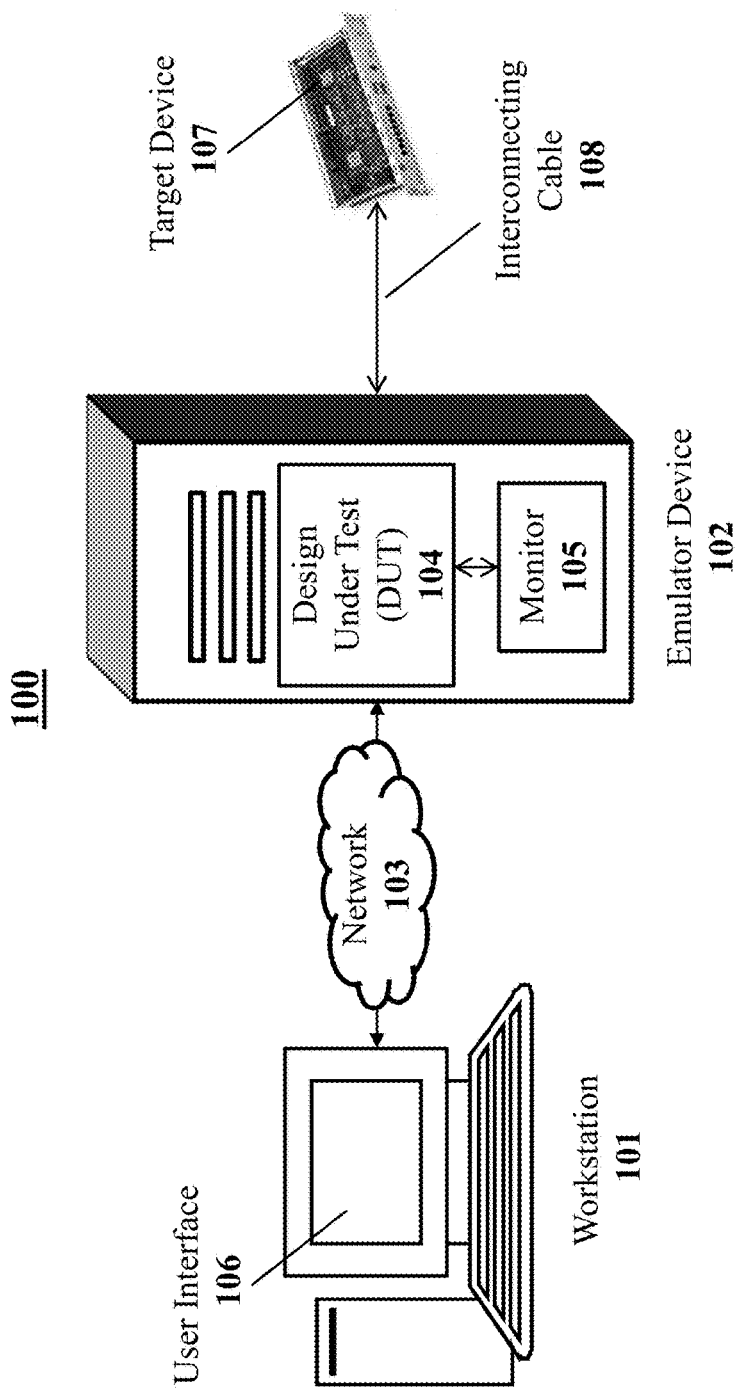
FIG. 1 shows an exemplary system for emulating a hardware design, according to an exemplary embodiment.

Reference will now be made to the illustrative embodiments illustrated in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one ordinarily skilled in the relevant art and having possession of this disclosure, are to be considered within the scope of the subject matter disclosed herein. The present disclosure is here described in detail with reference to embodiments illustrated in the drawings, which form a part here. Other embodiments may be used and/or other changes may be made without departing from the spirit or scope of the present disclosure. The illustrative embodiments described in the detailed description are not meant to be limiting of the subject matter presented here.

A logic system design, e.g., a design under test (DUT) in an emulation system, may have to be dynamically and rapidly debugged during the runtime of the emulation system. For example, the behavior of the DUT during runtime may warrant that more signals within the DUT or more attributes of the DUT may have to be monitored. In other words, previously unanticipated monitoring may have to be done. Furthermore, the DUT may be incrementally debugged. For example, a first portion of the DUT may be debugged at a first instance of time during the runtime of the emulation system and a second portion of the DUT may be debugged at a second instance of time.

A monitor may be used to perform various debugging operations during the runtime of the emulation of the DUT. For example, the monitor may retrieve data from the DUT during the emulation runtime and transmit the retrieved data to a workstation. Additionally or alternatively, the monitor may print out or render formatted messages at a user interface of a workstation using, e.g., a standard $display( ) system task. Furthermore, the monitor may have to pause and resume one or more emulator clocks to accordingly pause and resume the running of the DUT or a portion thereof. In addition, the monitor may have to inject debugging commands into the DUT during runtime. For example, the monitor may have to force a value of a design net or may have to dump contents of a memory to a file. In other words, the monitor may have to arbitrarily change one or more values and operations within the emulation system to debug a specific functionality of the DUT.

The monitor may also capture one or more waveforms from various portions of the DUT. The captured waveforms may indicate the values, such as the binary bits "0" or "1", generated by the respective portions of the DUT. During the debugging process, the monitor may stop capturing the waveform for a user or another system to verify whether the corresponding portion of the DUT is functioning correctly at a particular instance of time, i.e. the time when the monitor stopped capturing the waveform.

The systems and methods disclosed herein may allow a user to construct a dynamic register transfer level (DRTL) monitor using a high-level hardware description language (HDL) such as Verilog, System Verilog, and VHDL. In a first step, a system may receive a user programmed DRTL monitor module and a corresponding DRTL monitor instance constructed using an industry standard HDL. For example, the system may receive one or more HDL files that form the DRTL monitor module and the corresponding monitor instance. In a second step, the system may compile the one or more HDL files to generate a monitor to be included in one or more emulator devices including the DUT. Furthermore, the system may connect one or more input ports of the monitor with one or more signal sources within the DUT. Based on the signals received at the one or more input ports, the monitor may print out signal values, detect specified conditions, pause and continue one or more clocks, stop or continue waveform captures, and/or other debugging activities during the runtime of the system.

During the runtime of the system, multiple monitors can be added, removed or modified. Each monitor module is independent of the logic system design and doesn't have to be compiled with the logic system design, and therefore any number of monitor modules can be added to the DUT during runtime. In some embodiments, there may be no driving signal from a monitor to the DUT, e.g., the monitor may just receive and record various signals originating from the DUT. In these embodiments, the instance of the monitor may be removed from the system during runtime without affecting the functionality of the DUT. Therefore, embodiments disclosed herein describe systems and methods that provide for a dynamic construction and modification of a DRTL monitor during the runtime of the emulation system. As the monitor can be constructed during the runtime, no recompilation of the original design is needed—saving time during the testing and verification of the DUT.

FIG. 1 shows an exemplary emulation system 100 for implementing a dynamic register transfer level (DRTL) monitor, according to an exemplary embodiment. The emulation system 100 may include any number of computing devices, the exemplary embodiment may include a workstation 101, an emulator device 102, and a target device 107. The emulator device may further comprise a design under test (DUT) 104 and a monitor 105. The workstation 101 may be connected to the emulator device 102 via hardware and software components of one or more networks 103. The emulator device 102 may be connected to the target device using an interconnecting cable 108. A network 103 may also connect various computing devices with databases or other components of the emulation system 100. Examples of the network 103 include, but are not limited to, Local Area Network (LAN), Wireless Local Area Network (WLAN), Metropolitan Area Network (MAN), Wide Area Network (WAN), and the Internet. The communication over the network 103 may be performed in accordance with various communication protocols, such as Transmission Control Protocol and Internet Protocol (TCP/IP), User Datagram Protocol (UDP), and IEEE communication protocols.

The workstation 101 may be any type of computing device capable of receiving, storing, compiling, and transmitting a design constructed using a hardware description language (HDL) such as VHDL, Verilog, or System Verilog. For example, the workstation 101 may be a computing device comprising a processor/microcontroller and/or any other electronic component that performs one or more operations according to one or more programming instructions. The examples of the computing device may include, but are not limited to, a desktop computer, a laptop computer, a personal digital assistant (PDA), a smartphone, a tablet computer, and the like. The workstation 101 may be configured to communicate with the emulator device 102 of the system 100 through the one or more networks 103, using wired and/or wireless communication capabilities. The workstation 101 may include a user interface 106 such as a graphical user interface (GUI) that renders an interactive, graphical representation of the design being tested and verified. The user interface 106 may provide interactive tools to an user to construct, modify, and compile the design being tested and verified. The user interface 106 may also provide interactive tools to an user to transmit the compiled design to the emulator device 102. The user interface 106 may further include interactive tools to allow a user to construct, modify, or remove the monitor 105 during the runtime of the emulator device 102, e.g., when the emulator device 102 is running the DUT 104.

Emulator device 102 of the emulation system 100 may be responsible for compiling and executing emulation routines. Non-limiting examples of the emulation device 102 may include emulation chips, logic boards, data buses, wiring interfaces, data lanes, non-transitory machine-readable media, and processors, among others. The emulator device 102, such as emulation chips, may be programmed to process data inputs and generate data outputs according to instructions generated by compiling a schematic design ("netlist") of a particular logic system. A processor of the emulation system 100 may compile a machine-readable netlist file into executable code, which is then distributed as instruction sets to one or more emulation chips of the system. In some embodiments, the processor of the emulation system 100 may compile hardware specification described in a hardware description language such as VHDL or Verilog to generate the instruction sets. For each of the components of the system 100 receiving an instruction set, the instructions may indicate which other component of the system 100 is the source of a particular component's next data input, and which other component of the system 100 is the destination of the particular component's next data output.

The emulator device 102 may be logically organized into domains, which are subsets of the emulation device 102 allocated to execute a particular emulation routine. Domains may be the smallest unit of hardware resources of the emulator device 102 that the emulation system 100 is capable of allocating to emulate a logic system design associated with the target device 107 or a test vector. Each domain may comprise one or more emulation devices 102 allocated by a configuration module to execute a particular emulation routines while interacting with the target device 107 or the test vector. A domain (e.g., set of hardware resources) may be configured with execution parameters independent from both other domains and the rest of an emulation system 100 as whole. For example, each domain may comprise a separate execution clock that is independent from a system clock, and thus the domain may be independently schedulable from a user's perspective. It should be appreciated that a domain may be defined at any level of granularity within the emulation system 100, and may comprise any collection of hardware resources of the emulation system 100. Non-limiting examples of what constitutes a domain may include: one or more emulation chips, one or more processors on emulation chips, logical circuit boards, clusters of logical circuit boards, and any other collection hardware components that may be allocated to execute according to an independent clock. One ordinarily skilled in the art should appreciate the aforementioned complexity and other structural and functional complexity of the emulator device 102. However, for brevity, this disclosure describes two components, the device under test (DUT) 104 and monitor 105 within the emulator device 102. The DUT 104 and the monitor 105 may be implemented at any layer of abstraction within the emulator device 102.

The DUT 104 may be the logic system design being emulated in the emulator device 102. For example, the DUT 104 may comprise logic for components such as a central processing unit (CPU), a graphics processing unit (GPU), an application specific integrated circuit (ASIC), a field programmable gate array (FPGA). The DUT 105 may send outputs to and receives inputs from the target device 107. The DUT 105 may contain one or more aforementioned domains. In some instances, the DUT 105 may use almost all of the domains in the emulator device 102. In other instance, the DUT 105 may not use all of the domains of the emulator device 102.

The monitor 105 may include the logic used to debug the DUT 104 on the fly. For the debugging purpose, the monitor 105 may have input/output (TO) connections to various signal sources the DUT 104. For example, an input port of the monitor 105 may be connected to a clock signal or an output of a logic gate of the DUT 104. Based on the inputs received from the DUT 104, the monitor 105 may determine whether one or more triggering conditions have been met. A triggering condition may indicate to the monitor 105 to take an action, such as transmitting a formatted message to the user interface 106 of the workstation 101, and transmitting instructions to a processor of the emulation system 100 to cause stopping or resuming one or more clocks in the DUT 104, dumping contents of a memory in the DUT 104 into a file, and stopping or resuming the emulation of the DUT 104 itself.

The monitor 105 may include one or more domains not used by the DUT 104. The monitor 105 may be compiled separate and apart from the compilation of the DUT 104. The DUT 104 may generally be a stable logic system design that is not changed often once loaded into the emulator device 102. On the contrary, the monitor 105 may have to be modified based on multiple factors such as the portion of the DUT 104 being emulated by the emulator device 102, the behavior of the DUT 104 during the emulation. For example, a user may not have anticipated that a first portion of the DUT 104 may have to be debugged but may determine, based on the recent behavior of second portion of the DUT 104, that the first portion of the DUT 104 may have to be debugged. In some embodiments, for modifying the monitor 105, the emulation system 100 may allow the user to remove the existing monitor 105 and construct a new monitor 105. In these embodiments, removing an existing monitor 105 may not cause a problem because the existing monitor 105 may not transmit a drive signal to the DUT 104. In other words, the monitor 105 may instruct a processor of the emulation system 100 to temporarily pause the emulation of the DUT 104 or a portion thereof but may the monitor 105 not provide input signals for one or more gates of the DUT 104.

Figure 2:
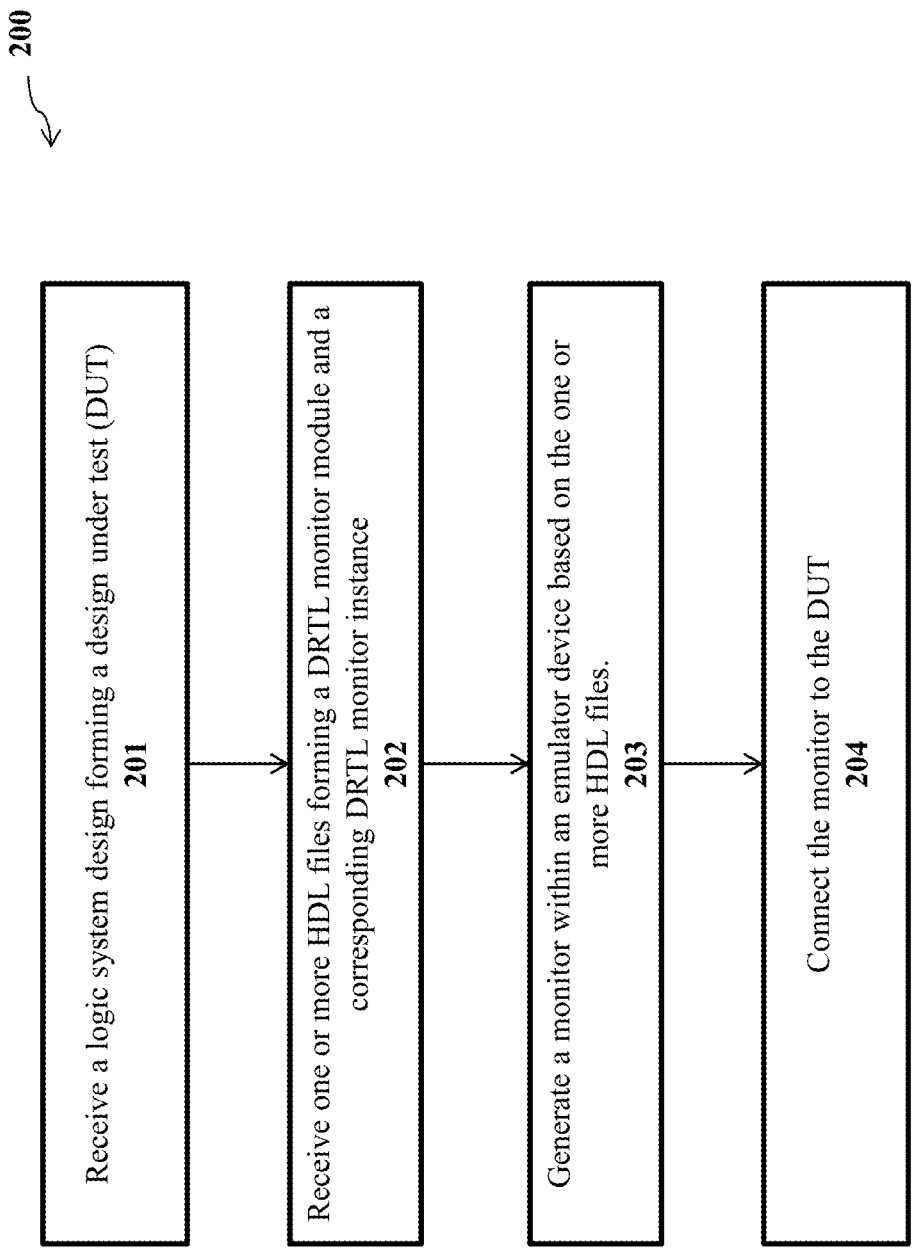
FIG. 2 shows an exemplary method for emulating a hardware design, according to an exemplary embodiment.

FIG. 2 shows an exemplary method 200 for implementing dynamic register transfer level (DRTL) monitor, according to an exemplary embodiment. Various components in an emulation system may implement one or more steps of the method 200. However, for the sake of brevity, the following steps are described as being implemented by the emulation system.

In a first step 201, the emulation system may receive a logic system design which may form a design under test (DUT) during the runtime of the emulation. One ordinarily skilled in art understands that the acronym DUT may refer to device under test and/or design under test. One ordinarily skilled in the art further understands that the DUT is the logic system design as emulated by the emulation system. In some instances, the logic system design may be pre-compiled, pre-synthesized, pre-partitioned, and pre-optimized; and the emulation system may download the logic system design into one or more emulator devices of the emulation system. In other instances, the emulation system may receive a non-compiled version of the logic design system in a hardware description language such as Verilog, System Verilog, or VHDL. In such instances, the emulation system may compile, synthesize, partition and optimize the received logic system. Even though an emulation system is primarily used for emulating a logic system design, one ordinarily skilled in the art appreciates that the emulation system may perform one or more of the aforementioned functions of compiling, synthesizing, partitioning, and optimizing a logic system design.

In a next step 202, the emulation system may receive one or more HDL files forming a DRTL monitor module and a corresponding DRTL monitor instance. The one or more HDL files may include a plurality of logic components and/or logic behavior which may perform as a monitor to debug the logic system design. For example, the one more HDL files may include connection ports to various signal sources within the logic system design forming the DUT. Furthermore, the one or more HDL files may include trigger conditions for one or more debugging operations, for example, stopping and/or resuming one or more clocks in the emulation system. The trigger conditions may be predicated on one more signals received by the monitor from the various signal sources within the DUT. For example, if signal A from the DUT is low and signal B also from the DUT is high, it may be constitute a trigger condition to stop clock C and transmit a message to the workstation that the trigger condition for stopping clock C has been met and clock C has been stopped accordingly. A subsequent trigger condition for restarting the clock C may be that signal A is high and signal B is high. The one or more HDL files may be in VHDL, Verilog, or System Verilog format. The one or more HDL files may be received from a workstation associated with the emulation system, and/or a remote server connected to the emulation system. In some embodiments, the emulation system may provide an interface to the user to define a DRTL monitor module and a DRTL monitor instance.

In a next step 203, the emulation system may generate a monitor within the one or more emulator devices based on the one or more HDL files. The emulation system may perform various operations such as logic synthesis, partitioning, compiling on the one or more HDL files such that the logic in the HDL files may be loaded into the one or more emulator devices to generate a monitor. The emulation system may perform the aforementioned operations and generate the monitor during the runtime of the emulation of the DUT. Therefore, the emulation system does not have to recompile the DUT when the emulation system generates the monitor from the one or more HDL files. In contrast to conventional systems where an emulated logic has to be compiled each time an associated debugging logic is generated or modified, the emulation system saves a user significant amount of time as the emulation system may compile the DUT and may generate, implement, and modify one or more monitors without having to recompile the DUT during the runtime of the compiled DUT.

In a next step 204, the emulation system may connect the monitor to the DUT during the runtime of the emulation of the DUT. More specifically, the emulation system may connect the connection ports in the monitor to the corresponding signal sources within the DUT. In some instances, the emulation system may determine that the monitor is associated with a portion of the DUT and may connect the monitor to one or more signal sources at that portion of the DUT. The monitor may use the signals received from the signal sources and determine if one or more trigger conditions have been met to perform various debugging operations, such as sending a formatted message to a user interface of the workstation.

Figure 3:
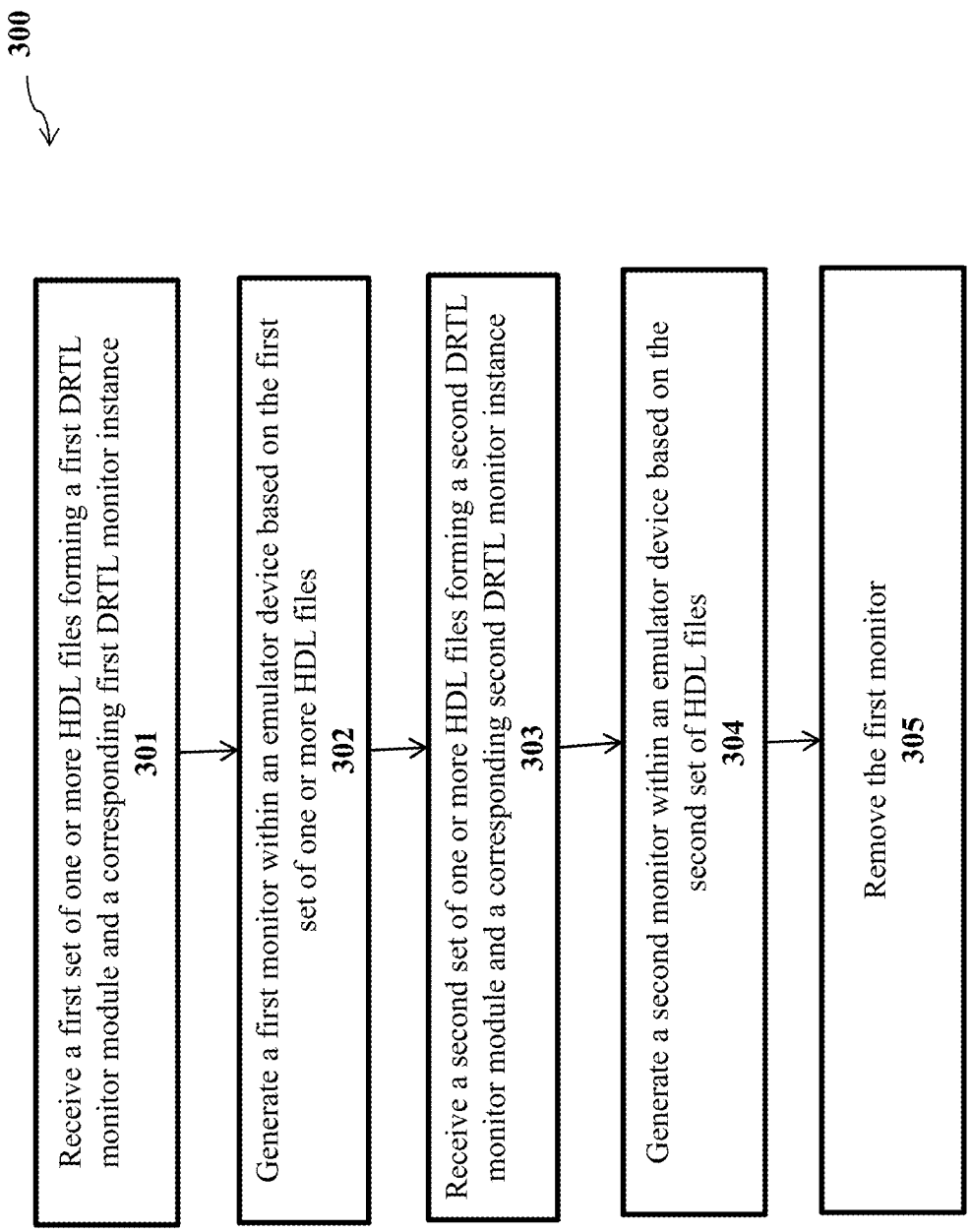
FIG. 3 shows an exemplary method for emulating a hardware design, according to an exemplary embodiment.

FIG. 3 shows an exemplary method 300 of implementing and modifying a dynamic register transfer level (DRTL) monitor, according to an exemplary embodiment. Various components in an emulation system may implement one or more steps of the method 300. However, for the sake of brevity, the following steps are described as being implemented by the emulation system.

In a first step 301, the emulation system may receive a first set of one or more HDL files forming a first DRTL monitor module and a corresponding first DRTL monitor instance. The first set of HDL files may include logic for debugging a first portion of a device under test (DUT). Alternatively or additionally, the first set of HDL files may include logic for debugging the DUT at a first interval of time.

In a next step 302, the emulation system may generate a first monitor within an emulator device based on the first set of one or more HDL files. The emulation system may perform various operations such as logic synthesis, partitioning, compiling on the first set of HDL files such that the logic in the HDL files may be loaded into the one or more emulator devices to generate a first monitor. The emulation system may perform the aforementioned operations and generate the first monitor during the runtime of the emulation of the DUT.

In a next step 303, the emulation system may receive a second set of one or more HDL files forming a second DRTL monitor module and a corresponding second DRTL monitor instance. The second set of HDL files may include logic for debugging a second portion of the DUT. Alternatively or additionally, the second set of HDL files may include logic for debugging the DUT at a second interval of time.

In a next step 304, the emulation system may generate a second monitor within the emulator device based on the second set of one or more HDL files. The emulation system may perform various operations such as logic synthesis, partitioning, compiling on the second set of HDL files such that the logic in the second set of HDL files may be loaded into the one or more emulator devices to generate the second monitor. The emulation system may perform the aforementioned operations and generate the second monitor during the runtime of the emulation of the DUT. In some implementations, the second monitor may be a modified version of the first monitor and may have been transmitted to the emulation system to replace the first monitor. Accordingly, in a next step 305, the emulation system may remove the first monitor.

In some embodiments, a user may indicate that both of the first and the second monitors be kept in emulator. In these embodiments, the emulation system may not remove the first monitor. In other embodiments, the second monitor may be temporary and may be transmitted to the emulation system to debug a particular functionality of the DUT not captured by the more permanent first monitor. In these embodiments, the emulation system may remove the second monitor after a period of time while keeping the first monitor.

The foregoing method descriptions and the process flow diagrams are provided merely as illustrative examples and are not intended to require or imply that the steps of the various embodiments must be performed in the order presented. The steps in the foregoing embodiments may be performed in any order. Words such as "then," "next," etc. are not intended to limit the order of the steps; these words are simply used to guide the reader through the description of the methods. Although process flow diagrams may describe the operations as a sequential process, many of the operations can be performed in parallel or concurrently. In addition, the order of the operations may be re-arranged. A process may correspond to a method, a function, a procedure, a subroutine, a subprogram, and the like. When a process corresponds to a function, the process termination may correspond to a return of the function to a calling function or a main function.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of this disclosure or the claims.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the claimed features or this disclosure. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module, which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the embodiments described herein and variations thereof. Various modifications to these embodiments will be readily apparent to those skilled in the art, and the generic principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A method of emulating hardware logic, the method comprising:
    receiving, by an emulation system, a first set of one or more hardware specification files forming a hardware logic design to be emulated;
    generating, by the emulation system, a device under test (DUT) within one or more emulator devices based upon the first set of hardware specification files;
    receiving, by the emulation system, a second set of one or more hardware specification files during the runtime of the DUT;
    generating, by the emulation system, a monitor within the one or more emulator devices based upon the second set of hardware specification files; and
    connecting, by the emulation system, one or more input ports of the monitor to one or more signal sources in the DUT such that the monitor receives one or more signals from the DUT.

2. The method of claim 1, wherein the second set of hardware specification files are in a high level hardware description language (HDL).

3. The method of claim 2, wherein the HDL is selected from the group consisting of: VHDL, Verilog, and System Verilog.

4. The method of claim 1, further comprising:
    removing, by the emulation system, the monitor from the one or more emulator devices during the runtime of the DUT.

5. The method of claim 1, further comprising:
    receiving, by the emulation system, a third set of one or more hardware specification files during the runtime of the DUT;
    generating, by the emulation system, a second monitor within the one or more emulator devices based upon the third set of hardware specification files; and
    connecting, by the emulation system, one or more input ports of the second monitor to one or more signal sources in the DUT such that the second monitor receives one or more signals from the DUT.

6. The method of claim 5, further comprising:
    connecting, by the emulation system, the one or more input ports of the monitor to one or more signal sources at a first portion of the DUT; and
    connecting, by the emulation system, the one or more input ports of the second monitor to one or more signal sources at a second portion of the DUT.

7. The method of claim 5, further comprising:
removing, by the emulation system, the second monitor from the one or more emulator devices during the runtime of the DUT.

8. The method of claim 1, further comprising:
generating, by the emulation system, a second monitor within the one or more emulator devices based upon the second set of hardware specification files; and
connecting, by the emulation system, one or more input ports of the second monitor to one or more signal sources in the DUT such that the second monitor receives one or more signals from the DUT.

9. The method of claim 8, further comprising
connecting, by the emulation system, the one or more input ports of monitor to one or more signal sources at a first portion of the DUT; and
connecting, by the emulation system, the one or more input ports of the second monitor to one or more signal sources at a second portion of the DUT.

10. The method of claim 1, further comprising:
receiving, by one or more chips in the monitor, one or more signals from the DUT; and
determining, by the one or more chips in the monitor, that one or more triggering conditions have been met based upon the one or more signals from the DUT; and
transmitting, by the one or more chips in the monitor, a formatted message to a user interface associated with the emulation system based upon determining that one or more triggering conditions have been met.

11. A system for emulating hardware logic, the system comprising:
a computer configured to:
receive a first set of one or more hardware specification files forming a hardware logic design to be emulated;
generate a device under test (DUT) within one or more emulator devices based upon the first set of hardware specification files;
receive a second set of one or more hardware specification files during the runtime of the DUT;
generate a monitor within the one or more emulator devices based upon the second set of hardware specification files; and
connect one or more input ports of the monitor to one or more signal sources in the DUT such that the monitor receives one or more signals from the DUT.

12. The system of claim 11, wherein the second set of hardware specification files are in a high level hardware description language (HDL).

13. The system of claim 12, wherein the HDL is selected from the group consisting of: VHDL, Verilog, and System Verilog.

14. The system of claim 11, wherein the computer is further configured to:
remove the monitor from the one or more emulator devices during the runtime of the DUT.

15. The system of claim 11, wherein the computer is further configured to:
receive a third set of one or more hardware specification files during the runtime of the DUT;
generate a second monitor within the one or more emulator devices based upon the third set of hardware specification files; and
connect one or more input ports of the second monitor to one or more signal sources in the DUT such that the second monitor receives one or more signals from the DUT.

16. The system of claim 15, wherein the computer is further configured to:
connect the one or more input ports of the monitor to one or more signal sources at a first portion of the DUT; and
connect the one or more input ports of the second monitor to one or more signal sources at a second portion of the DUT.

17. The system of claim 15, wherein the computer is further configured to:
remove the second monitor from the one or more emulator devices during the runtime of the DUT.

18. The system of claim 11, wherein the computer is further configured to:
generate a second monitor within the one or more emulator devices based upon the second set of hardware specification files; and
connect one or more input ports of the second monitor to one or more signal sources in the DUT such that the second monitor receives one or more signals from the DUT.

19. The system of claim 18, wherein the computer is further configured to:
connect the one or more input ports of monitor to one or more signal sources at a first portion of the DUT; and
connect the one or more input ports of the second monitor to one or more signal sources at a second portion of the DUT.

20. The system of claim 11, wherein the monitor is configured to:
receive one or more signals from the DUT;
determine that one or more triggering conditions have been met based upon the one or more signals from the DUT; and
transmit a formatted message to a user interface associated with the emulation system based upon determining that one or more triggering conditions have been met.

* * * * *